(12) United States Patent
Lenz

(10) Patent No.: US 8,164,354 B2
(45) Date of Patent: Apr. 24, 2012

(54) PROXIMITY DETECTION SYSTEM

(75) Inventor: Robert G. Lenz, Springfield, OH (US)

(73) Assignee: Process Equipment Co. of Tipp City, Tipp City, OH (US)

( * ) Notice: Subject to any disclaimer, the term of this patent is extended or adjusted under 35 U.S.C. 154(b) by 946 days.

(21) Appl. No.: 11/943,630

(22) Filed: Nov. 21, 2007

(65) Prior Publication Data

US 2008/0122458 A1 May 29, 2008

Related U.S. Application Data

(60) Provisional application No. 60/867,514, filed on Nov. 28, 2006.

(51) Int. Cl.
G01R 27/26 (2006.01)
(52) U.S. Cl. ........................ 324/687; 324/688
(58) Field of Classification Search .................. 324/600, 324/687, 688
See application file for complete search history.

(56) References Cited

U.S. PATENT DOCUMENTS

| | | | |
|---|---|---|---|
| 4,661,797 A | 4/1987 | Schmall | |
| 5,166,679 A | 11/1992 | Vranish | |
| 5,214,388 A | 5/1993 | Vranish | |
| 5,276,629 A | 1/1994 | Reynolds | |
| 5,363,051 A * | 11/1994 | Jenstrom et al. | 324/661 |
| 5,373,245 A | 12/1994 | Vranish | |
| 5,442,347 A * | 8/1995 | Vranish | 340/870.37 |
| 5,469,364 A | 11/1995 | Hughey et al. | |
| 5,521,515 A | 5/1996 | Campbell | |
| 5,539,292 A | 7/1996 | Vranish | |
| 5,586,042 A | 12/1996 | Pisau et al. | |
| 5,726,581 A | 3/1998 | Vranish | |
| 6,066,244 A * | 5/2000 | Nylander et al. | 204/435 |
| 6,429,782 B2 * | 8/2002 | Pavatich et al. | 340/686.6 |
| 6,452,514 B1 * | 9/2002 | Philipp | 341/33 |
| 6,559,658 B1 | 5/2003 | Brandt | |
| 6,712,769 B2 * | 3/2004 | Freund et al. | 600/503 |
| 6,847,354 B2 | 1/2005 | Vranish | |
| 2003/0076118 A1 | 4/2003 | Adams et al. | |
| 2004/0249584 A1 | 12/2004 | Gibb et al. | |

(Continued)

FOREIGN PATENT DOCUMENTS

EP 0954098 11/1999

(Continued)

OTHER PUBLICATIONS

Luis-Miguel Paredes Sanchez; Invitation to Pay Additional Fees and Communication Relating to the Results of the Partial International Search; International application No. PCT/US2007/085322; Feb. 3, 2009; European Patent Office; Netherlands.

(Continued)

Primary Examiner — Jeff Natalini
(74) Attorney, Agent, or Firm — Thomas E. Lees, LLC

(57) ABSTRACT

Proximity sensing arrangements utilize one or more sensing devices to detect and/or to discern objects that are or become proximate, or are expected to be proximate to a position of interest. For example, one or more capacitive sensors may be distributed to locations about a machine, e.g., attached to, incorporated with, or otherwise associated with a moving or otherwise operating component of the machine. Corresponding control electronics drive each capacitive sensor, using a corresponding excitation signal, as well as process information read from each capacitive sensor to make intelligent proximity related decisions.

8 Claims, 11 Drawing Sheets

U.S. PATENT DOCUMENTS

2005/0261865 A1 11/2005 Gibb et al.

FOREIGN PATENT DOCUMENTS

| EP | 1583236 | * 10/2005 |
| --- | --- | --- |
| EP | 1583236 A1 | * 10/2005 |
| WO | 2004023526 | 3/2004 |
| WO | 2008025422 | 3/2008 |

OTHER PUBLICATIONS

Hausser, Thomas; International Search Report and Written Opinion of the International Searching Authority; International application No. PCT/US2007/085322; Apr. 14, 2009; European Patent Office; Netherlands.

E. Cheung, COS changeout with Capaciflectors, 11 pgs., Michigan State University, USA.

A. Almukairin,, Control Circuitry for Capaciflector Sensors, ECE 480 Electrical and Computer Engineering Capstone Design, Department of Electrical & Computer Engineering, 8 pgs., Michigan State University, Nov. 2005, USA.

R. Volpe, R. Ivlev, Year End Task Report for The Prototype Safety System for Robots Near Flight Hardware, Jet Propulsion Laboratory, California Institute of Technology, California, 34 pgs., Oct. 1993, USA.

The "Capaciflector" Proximity Sensor, Dexterous Manipulation Laboratory, Apr. 2008, http://www-cdr.stanford.edu/Touch/previous_projects/capaciflector.html, Apr. 2008, 3 pgs., USA.

L. K. Baxter, Capacitive Sensors, Jul. 2000, 17 pgs., USA.

C. Snyder and F. Mopsik, A Precision Capacitance Cell for Measurement of Thin Film Out-of-Plane Expansion—Part III: Conducting and Semiconducting Materials, IEEE Transactions on Instrumentation and Measurement, vol. 50, No. 5, Oct. 2001, 4 pgs., USA.

J. Vranish, V. Lumelsky, J. Clark, R. Boller, A.Joshua, Virtual Feel Sensor.

SRV-1 Blackfin Camera, Robotic Image Processing,ThereminVision Sensor, http://www.robots.net/article/1170.html, 2 pgs.

\* cited by examiner

PROXIMITY DETECTION SYSTEM

CROSS-REFERENCE TO RELATED APPLICATIONS

This application claims the benefit of U.S. Provisional Patent Application Ser. No. 60/867,514 filed Nov. 28, 2006, entitled "PROXIMITY SENSING SYSTEM", the disclosure of which is hereby incorporated by reference.

BACKGROUND OF THE INVENTION

The present invention relates to systems, computer program products and methods for proximity sensing, such as may be utilized for collision avoidance, obstacle detection and other tasks where it is desirable to detect, track, monitor or otherwise recognize either the presence of objects that are or become proximate to a position of interest or the absence of objects proximate to the position of interest.

Many systems comprising automated and semi-automated machines, transport mechanisms, robotic devices, tools and other industrial devices include one or more components that move or otherwise operate within a defined space. The operation of such components within their defined space is typically initiated to perform work corresponding to a predetermined task and may be programmably automated, autonomously implemented, manually controlled or directed, or otherwise determined by the particular task being implemented. However, objects in the same space as the moving or otherwise operating component may cause unintentional contact with the component. Further, under certain circumstances, even a stationary component of a system may be exposed to the potential of unintentional contact with objects moving within the space of the stationary component.

BRIEF SUMMARY OF THE INVENTION

According to an aspect of the present invention, a proximity detection system comprises a capacitive sensor having a sense electrode that is arranged to secure to a surface of a system component, an excitation source that generates an excitation signal for driving the capacitive sensor and a circuit that couples the excitation source to the capacitive sensor such that when the excitation signal from the excitation source drives the capacitive sensor, a capacitive field is generated relative to the sense electrode that corresponds to the capacitance of the capacitive sensor, wherein the presence of objects that are or become proximate to the capacitive sensor alter the capacitive field thus changing the overall capacitance of the capacitive sensor. The system also comprises a monitor that performs measurements of the circuit where the measurements are influenced by the capacitive field associated with the capacitive sensor and a controller operatively configured to evaluate one or more measurements taken by the monitor and to trigger a predetermined action if the evaluation corresponds to a triggering event. The controller is configured to dynamically update at least one parameter that alters the evaluation with regard to the triggering event to accommodate changes in at least one system condition.

According to another aspect of the present invention, a method of detecting proximity comprises providing a capacitive sensor having a sense electrode that is arranged to secure to a surface of a system component and utilizing an excitation source to generate an excitation signal that drives the capacitive sensor such that a capacitive field is generated relative to the sense electrode that corresponds to the capacitance of the capacitive sensor, wherein the presence of objects that are or become proximate to the capacitive sensor alter the capacitive field thus changing the overall capacitance of the capacitive sensor. The method also comprises collecting measurements that are related to the capacitive field associated with the capacitive sensor and evaluating one or more measurements taken to trigger a predetermined action if the evaluation corresponds to a triggering event. The evaluation comprises filling a circular buffer with the collected measurements, filtering the collected measurements by computing at least one discrete Fourier transform component from the collected measurements in the circular buffer, evaluating at least one computed Fourier transform component, triggering a predetermined action if the evaluation corresponds to a triggering event and dynamically updating at least one parameter that alters the evaluation with regard to the triggering event to accommodate changes in at least one system condition.

According to yet another aspect of the present invention, a proximity detection system comprises a capacitive sensor that couples to a surface of a first system component to sense the presence of objects of interest that are or become proximate to the capacitive sensor. The system also comprises a capacitive circuit comprising the capacitive sensor, a drive shield positioned between the capacitive sensor and a second system component that is not associated with the capacitive sensor and an excitation source that generates an excitation signal for driving both the drive shield and the capacitive circuit including the capacitive sensor. Still further, the system comprises a monitoring circuit that performs a measurement of the capacitive circuit that corresponds to capacitance of the capacitive circuit, wherein the capacitance of the capacitive circuit is influenced by a capacitive field associated with the capacitive sensor. The system also comprises a controller operatively configured to perform a comparison of the measurement with a function or threshold value and to trigger a predetermined action if the comparison corresponds to a triggering event, wherein the drive shield prevents the controller from triggering predetermined action, even if proximate to the capacitive sensor.

BRIEF DESCRIPTION OF THE SEVERAL VIEWS OF THE DRAWINGS

The following detailed description of various embodiments of the present invention can be best understood when read in conjunction with the following drawings, where like structure is indicated with like reference numerals, and in which.

DETAILED DESCRIPTION OF THE INVENTION

The various aspects of the present invention may be embodied as systems, methods including computer-implemented methods, and/or computer program products. Also, various aspects of the present invention may take the form of an entirely hardware embodiment, an entirely software embodiment (including firmware, resident software, microcode, etc.) or an embodiment combining software and hardware, wherein the embodiment or aspects thereof may be generally referred to as a "circuit," "module" or "system." Furthermore, various aspects of the present invention may take the form of a computer program product on a computer-usable storage medium having computer-usable program code embodied in the medium.

In the detailed description, reference is made to the accompanying drawings that form a part hereof, and in which is shown by way of illustration, and not by way of limitation, specific embodiments in which the invention may be practiced. It is to be understood that other embodiments may be utilized and that changes may be made without departing from the spirit and scope of various embodiments of the present invention.

Figure 1:
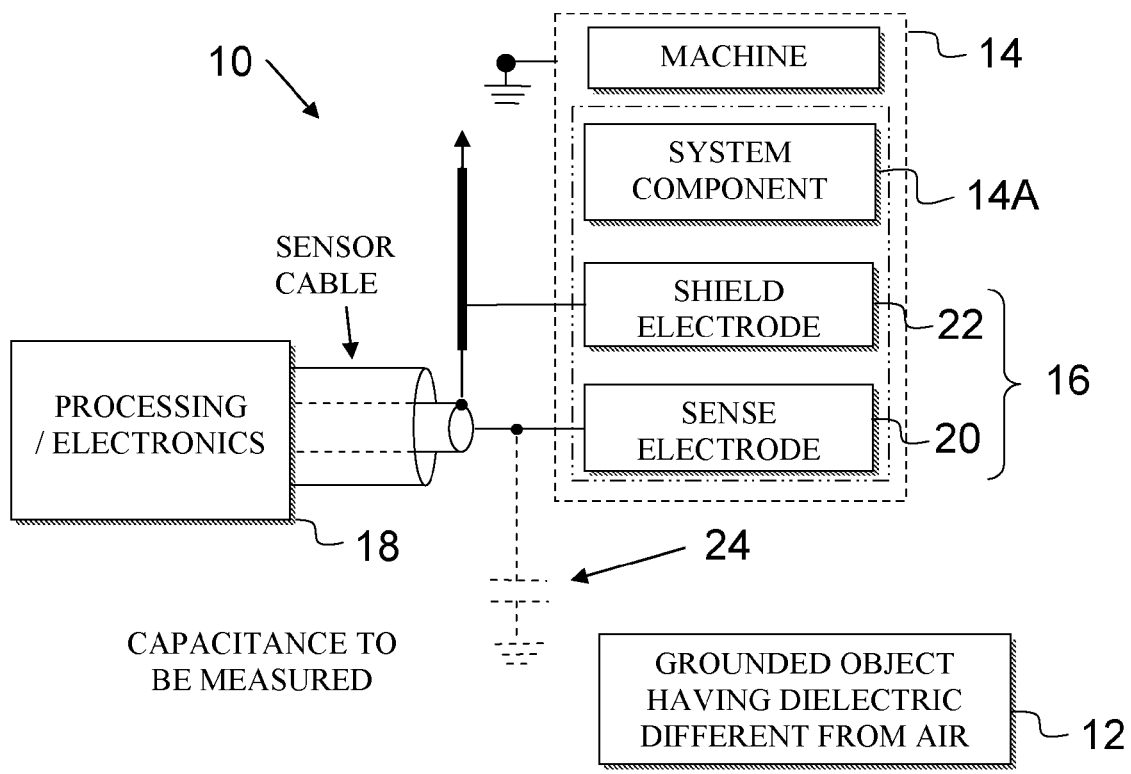
FIG. 1 is a block diagram of an exemplary capacitive sensor arrangement according to at least one aspect of the present invention.

Referring now to the drawings and particularly to FIG. 1, a proximity detection system 10 is illustrated, which can detect the presence of objects 12 in proximity to one or more positions of interest in a defined space. In a typical application, the proximity detection system 10 may be implemented as part of, or otherwise integrated with, a larger system, such as to monitor positions of interest to a machine 14 for collision avoidance, obstacle detection and/or other tasks such as where it may be desirable to detect, track, monitor or otherwise recognize either the presence of objects that are or become proximate to a position of interest or the absence of objects proximate to the position of interest.

The term "system" is intended to be considered in broad and general terms herein, so as to include, for example, one or more automated or semi-automated machines such as inspection machines, processing/finishing/handling machines, milling and other cutting machines, a machine sub-assembly, a group of related or otherwise interacting machines, one or more transport mechanisms, robots and other robotic devices, tools and/or industrial devices or any other arrangement where proximity sensing is desired, such as to prevent or otherwise mitigate proximity-based or contact-based damage to structures of the system.

The proximity detection system 10 comprises, in general, at least one capacitive sensor 16 coupled to corresponding control electronics 18. Each capacitive sensor 16 is utilized to designate a position of interest within a defined space to the machine 14, and may be coupled to a surface of a system component 14A, such as a movable machine part or a machine part that might otherwise potentially contact unintended objects within a defined space in which the part is located. As will be described in greater detail below, the presence (or absence) of objects that are of interest in detecting may include machinery, tooling, a work piece, environmental structures, people, etc. that are or become proximate to the capacitive sensor 16 and correspondingly, the system component 14A that the capacitive sensor 16 is attached to. As illustrated, each capacitive sensor 16 comprises a sensor plate, also referred to herein as a sense electrode 20, that is spaced from the corresponding system component 14A by a shielding plate, which is also referred to herein as a shield electrode 22.

The control electronics 18 contains circuitry necessary to generate an electric field about the sense electrode 20. The control electronics 18 drives the shield electrode 22 coincident with the sense electrode 20 so that the generated electric field is reflected away from the machine 14 proximate to the sense electrode 20, which extends the range of the capacitive sensor 16 in the direction(s) of interest. The control electronics 18 also measures the field loading caused by objects 12 moved into the field proximate to the sense electrode 20. Still further, the control electronics 18 may analyze the field loading and trigger the appropriate response, or the control electronics 18 may pass the measured information along to another processor (not shown) for analysis and/or action.

More particularly, the sense electrode 20 acts as one plate of a capacitor 24. As such, for purposes of illustration, a capacitor is schematically illustrated in FIG. 1 in phantom lines. The other plate required to complete the capacitor 24 is defined by any grounded object 12 that is in, or moves into, proximity with the sense electrode 20 that has a dielectric constant different from air in the exemplary implementation. Essentially, as the object 12 approaches the vicinity of the sense electrode 20, the electric field around the capacitive sensor 16 is altered. This change in the electric field is detected by the control electronics 18. The control electronics 18 may then perform a predetermined operation as the specific application dictates. Thus, an approach may be devised for the system, e.g., the machine 14, to address unexpected or unanticipated events by detecting, tracking, monitoring or otherwise recognizing the proximity (or absence of proximity) of objects 12 in space with reference to the capacitive sensor 16.

For example, a controller, which may be provided as part of the control electronics 18, may be operatively configured to evaluate one or more measurements that are influenced by the capacitive field associated with the capacitive sensor 16 and to trigger a predetermined action if the evaluation corresponds to a triggering event. In this regard, the controller may perform a comparison of a threshold value to a measurement, perform a calculation or otherwise perform a manipulation of information related to the capacitance of the capacitor 24. The controller may further trigger a predetermined action, e.g., output a control signal or message to a host application or otherwise take necessary action, e.g., to implement a collision avoidance maneuver, to perform other remediation or take other action if the comparison corresponds to a triggering event. Thus, for example, if an unexpected object is or becomes proximate to the capacitive sensor 16 such that the measured capacitance exceeds a threshold value or otherwise causes some other defined condition(s) to be satisfied, an appropriate corrective action may be taken, such as to avoid contact between a system component 14A and a corresponding object within the defined space of the part.

As another example, the capacitive sensor 16 may be used to identify the lack of presence (absence) of an anticipated or expected object. In this regard, assume that the capacitive sensor 16 is secured to an arm of an inspection machine. As the arm approaches a work piece to be inspected, it is anticipated that the measured field will change as a direct result of the proximity of the work piece. However, if the field does not change by an appropriate amount at a position of the arm where a change in the capacitive measurement is expected, then a predetermined action may be triggered, such as a warning or message that the work piece to be inspected is missing.

As yet another example, the capacitive sensor 16 may be used to identify the detection of an anticipated or expected object. In this regard, assume that the capacitive sensor 16 is secured to an arm of an inspection machine. As the arm approaches a work piece to be inspected, it is anticipated that the measured field will change as a direct result of the proximity of the work piece. If the field appropriately changes at a position of the arm where a corresponding change in the capacitive measurement is expected, e.g., based upon a predetermined signature of capacitive field as modified by the expected work piece, then an inference may be drawn that the proper part is available for inspection, which may trigger a next step in an inspection workflow.

Correspondingly, under certain circumstances, the capacitive sensor 16 may even be able to tell that a wrong part has been presented for inspection (or in the general case, when a wrong object of interest has been detected). For example, if the measured capacitance is higher or lower than what is expected, e.g., where the wrong part/object has a different dielectric constant than the expected part or otherwise disrupts the field of capacitive sensor 16 in an unexpected way, an appropriate action can be implemented.

As yet a further example, one or more sensors 16 can be used to locate objects, and/or position a part of a machine proximate to an object that is at a known or unknown location, such as by scanning a bound volume of space for changes in the field of the capacitive sensor 16.

Figure 2:
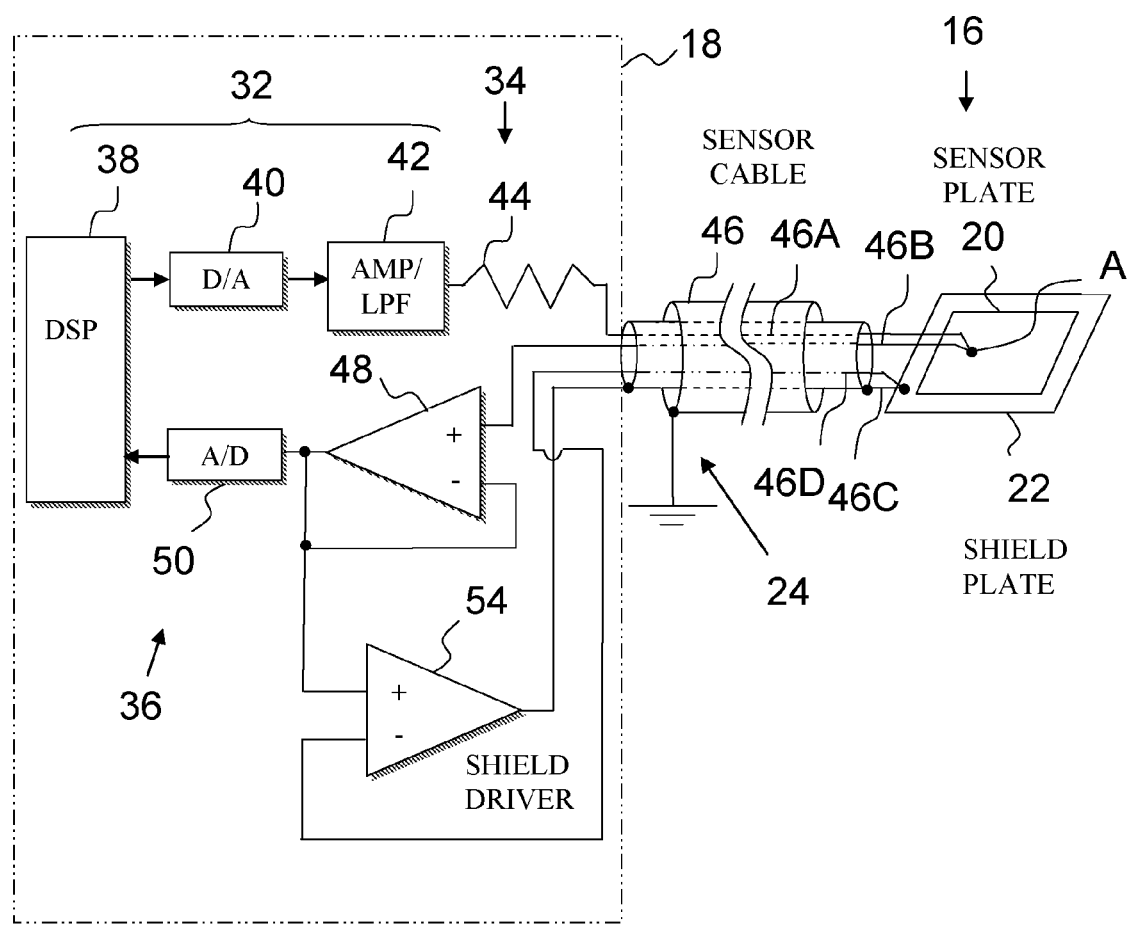
FIG. 2 is a schematic block diagram illustrating an exemplary arrangement of the control electronics that may be utilized with the capacitive sensor of FIG. 1.

Referring to FIG. 2, an exemplary implementation of the control electronics 18 comprises in general, an excitation source 32 and a circuit 34 that couples the excitation source 32 to the capacitive sensor 16. The control electronics 18 also comprise a monitor 36 and a controller 38. The excitation source 32 provides an excitation signal that drives the circuit 34 and correspondingly, the capacitive sensor 16. The monitor 36 performs measurements of the circuit where the measurements are influenced by the capacitive field associated with the capacitive sensor 16 and the controller 38 evaluates one or more measurements taken by the monitor and triggers a predetermined action if the evaluation corresponds to a triggering event as will be described in greater detail herein.

In an exemplary implementation, the excitation source 32 comprises a digital signal controller 38 having one or more signal lines that are coupled to a digital to analog converter 40. The output of the digital to analog converter 40 may further be coupled to a signal conditioning circuit 42. The output of the signal conditioning circuit 42 is the excitation signal used to drive the circuit 34. The controller 38, e.g., a suitable microcontroller or other digital signal processing device executes code to output a digital representation of the desired excitation signal. For example, the controller 38 may implement suitable software code to generate a periodic signal such as a sine wave, square wave, triangle wave, sawtooth, etc., by retrieving data values from an M-point lookup table that is stored in a memory accessible by the controller 38. The M-points may collectively describe points that approximate a single cycle of the desired excitation signal. The digital representation of the excitation signal output from the digital signal processor thus comprises an M-step approximation of the excitation signal and may be provided as a pulse-width modulated output, a stream of multi-bit words, or in any other suitable format, e.g., as is compatible with the technology utilized to implement the digital to analog converter 40.

The digital to analog converter 40 converts the digital representation of the excitation signal to an analog representation of the excitation signal. The signal conditioning circuit 42 comprises circuitry necessary to properly condition the analog excitation signal and/or drive the network 34, such as by implementing any combination of buffers, impedance converters, amplifiers, filters, etc. For example, the signal conditioning circuit 42 may smooth the output of the digital to analog converter 40 using a low pass filter, then buffer and/or amplify the signal using an amplifier, e.g., a non-inverting, zero phase shift, unity gain amplifier. The output of the amplifier is used to drive the network 34, including the sense electrode 20 (shown in FIG. 2 as a sensor plate for purposes of illustration) of the capacitive sensor 16.

Although one illustrative implementation of the excitation source 32 is schematically shown in FIG. 2, other arrangements may be suitably provided to generate the excitation signal, including the use of analog circuitry, such as an analog oscillator circuit. Further, alternative digital, analog and/or combinations of digital and analog implementations may also be used. Also, the various components of the excitation source 32 may be integrated into one or more physical components, e.g., an application specific integrated circuit (ASIC), microcontroller, reconfigurable device, such as a field programmable gate array (FPGA), programmable gate array (PGA), Programmable Logic Arrays (PLA), programmable oscillator, direct digital synthesis chip and/or other necessary logic. Also, as will be described in greater detail herein, the shape of the excitation signal may be relatively unimportant if subsequent narrow band filtering is used to reject undesired harmonics that may be present.

In an exemplary implementation, the excitation signal comprises a periodic signal and the circuit 34 comprises a resistance component schematically shown as resistor 44 coupled to the capacitive sensor 16. As another example, the circuit 34 may comprise a voltage divider/filter circuit such as using resistance and capacitance components. The implementation of any desired low pass filtering, e.g., within the circuit 34 or the signal conditioning circuit 42 may depend, for example, upon system specifications, such as the selected excitation frequency f or anticipated range of frequencies over which the excitation signal may be operated.

A sensor cable 46 is utilized to couple the resistor 44 to the capacitive sensor 16. For example, as illustrated, the excitation signal is communicated between the resistor 44 and the sensor plate 20 of the capacitive sensor 16 via a first conductor 46A of the sensor cable 46. A second conductor 46B of the sensor cable 46 provides a return from the sensor plate 20 to the monitor 36.

The total capacitance that is measured by the monitor 36 comprises the capacitance that corresponds to the field created with respect to the sense electrode 20, i.e., the capacitance of the capacitor 24 formed in part, by the sense electrode 20, as will be explained in greater detail herein. Other implementations of the circuit 34 may be utilized so long as changes to the field associated with the sense electrode 20 can be determined.

For maximum sensitivity to small changes in sensor capacitance, the resistance of the resistor 44 may be matched to the anticipated nominal capacitance. In an exemplary implementation, the magnitude of the gain of the circuit 34 is given by:

$$|G| = \frac{1}{\sqrt{1 + (2 \cdot \pi \cdot f \cdot r \cdot c)^2}}$$

To find the resistance that causes the maximum rate of change of gain with respect to capacitance, the second derivative of the above expression may be set to zero:

$$\frac{d^2}{dc^2} \frac{1}{\sqrt{1 + (2 \cdot \pi \cdot f \cdot r \cdot c)^2}} = 4 \cdot \pi^2 \cdot f^2 \cdot r^2 \cdot \frac{(8 \cdot \pi^2 \cdot f^2 \cdot r^2 \cdot c^2 - 1)}{(1 + 4 \cdot \pi^2 \cdot f^2 \cdot r^2 \cdot c^2)^{\frac{5}{2}}} = 0$$

This results in the following condition:

$$2 \cdot \pi \cdot f \cdot r \cdot c = \frac{1}{\sqrt{2}}$$

If this condition is met, the voltage divider gain will be approximately 0.816. Therefore, to find the correct value of resistance, r is set to zero and the resulting discrete Fourier transform reading is recorded. Then r is increased until the reading drops to 0.8 times the original reading. This is the resistance to use for maximum sensitivity. The first derivative of the gain gives the sensitivity:

$$\frac{d}{dc} \frac{1}{\sqrt{1 + (2 \cdot \pi \cdot f \cdot r \cdot c)^2}} = \frac{-4}{(1 + 4 \cdot \pi^2 \cdot f^2 \cdot r^2 \cdot c^2)^{\frac{3}{2}}} \cdot \pi^2 \cdot f^2 \cdot r^2 \cdot c$$

If the optimizing condition is substituted into the above expression, the sensitivity becomes:

$$\frac{-1}{2 \cdot c \cdot (1.5)^{1.5}} = \frac{-.272}{c}$$

This shows that the magnitude of the sensitivity can be maximized by minimizing the ambient capacitance, c. The capacitance can be minimized by keeping sensor cable 46 as short as possible and by utilizing active shielding.

In an illustrative example, the excitation signal comprises a constant amplitude periodic signal having a constant frequency f. Accordingly, the amplitude of the voltage at frequency f is a measure of the total capacitance of the network 34, including the capacitance associated with the field about the sense electrode 20 of a corresponding capacitive sensor 16. If two or more sensors 16 operate in the same environment, e.g., on different component surfaces of the same machine, then each capacitive sensor 16 can be driven at a different excitation frequency to prevent interference from the electric fields generated by nearby sensors 16. Under this arrangement, the frequency of a first capacitive sensor 16 may be chosen so that no harmonics fall within the sensitive range of another capacitive sensor 16. Moreover, band filtering of harmonic content and/or other signal processing of the measured excitation signals can relax the requirements for different excitation signals. The implementation of multiple sensors is described in greater detail herein.

In the illustrated system, the monitor 36 senses the capacitance of the circuit 44 by measuring the amplitude of the voltage that appears at the sensor plate, i.e., sense electrode 20 at point A. In this regard, the monitor 36 comprises a first buffer/amplifier 48 that buffers and/or amplifies the signal from point A. The impedance at node A is likely relatively high, so the buffer/amplifier 48, e.g., an instrumentation amplifier, may be provided to isolate node A from other circuitry. The output of the first buffer/amplifier 48 is coupled to an analog to digital converter 50, which outputs a digital representation of the output of the first buffer/amplifier to the controller 38. In an exemplary implementation of the processing electronics 18, the analog to digital converter 50 is synchronized to the corresponding digital to analog converter 40, as will be described in greater detail below.

A copy of the input to the analog to digital converter 50 is optionally scaled, such as by a compensation circuit, e.g., a voltage divider (not shown) and the optionally scaled signal is buffered by a driver circuit 54, e.g., as implemented by a shield driver amplifier and optional additional circuitry as required. The output of the driver circuit 54 is utilized to drive the shield electrode 22 of the capacitive sensor 16 via a third conductor of the sensor cable 46. Further, a fourth conductor of the sensor cable 46 provides a feedback signal from the shield plate, i.e., shield electrode 22 back to an input of the driver circuit 54. The driver circuit 54 may alternatively be replaced with any suitable amplifier, signal conditioning and scaling circuitry.

Remote sensing is used in both the first buffer/amplifier 48, i.e., the signal amplifier and the driver circuit 54, such as the illustrated shield driver amplifier to reduce the effects of cable impedance. Also, as shown, both amplifiers are connected as voltage followers. However, gain scaling, impedance conversion and other additional processing may be implemented based upon the specific requirements. As an example, the first buffer/amplifier 48 (signal amplifier) may comprise a type of operational amplifier that has a low input offset current to minimize the loading of the sensor circuit by the amplifier and the driver circuit 54 (shield amplifier) may comprise a type of operational amplifier that can drive high capacitive loads.

As noted above, the capacitance of the circuit is influenced by the capacitive field generated by the capacitive sensor. In this regard, the field that is being measured is the field that is being generated, e.g., via the excitation signal. It is not some undefined, random field that is being measured.

As noted above, the output of the analog to digital converter 50 is fed back to the controller 38 for further processing. As an example, the controller 38 may compute the Discrete Fourier Transform (DFT) coefficient of the signal fed back from the analog to digital converter 50 at the excitation frequency f used to drive the network 34. The DFT coefficient is a complex number that describes the magnitude as well as the phase angle of the signal measured at node A, taken at the excitation frequency f. By limiting the DFT computation to the known excitation frequency f, interference at other frequencies may be minimized and computational overhead of implementing a more complex DFT algorithm is avoided. However, other filtering and analyzing processes may be performed. For example, as will be described in greater detail herein, what is referred to as a DFT filter herein may be considered a demodulator because its output is not a filtered version of its input stream. Instead, the output is a measure of the amplitude of the signal at the tuned frequency. If the sample size, referred to as 'M', is chosen appropriately, then the phase angle of the signal can be computed. If this is the case, a DFT demodulator could be used as a very sensitive, fast, and low-noise LVDT signal conditioner. Also, the DFT may be replaced by a bandpass filter (analog or digital) or other suitable filter(s).

The above process is periodically repeated, e.g., whenever one complete cycle of the excitation signal has been generated. Moreover, the rate at which the DFT coefficients are processed may be reduced, such as by filtering the DFT coefficient stream with a decimating low pass filter. The additional filtering and processing may be performed, for example, within the controller 38.

Other suitable techniques may alternatively be utilized to implement the control electronics 18. For example, the capacitive sensor 16 may be coupled to a tuned oscillator circuit. Under this arrangement, changes in the capacitance between the sense shield 20 and the object 12 alter the frequency of a tuned oscillator circuit. The amount of capacitance change corresponds to a change in the frequency of the oscillator. Still further techniques may alternatively be utilized to detect changes in capacitance of the capacitive sensor 16.

Figure 3:
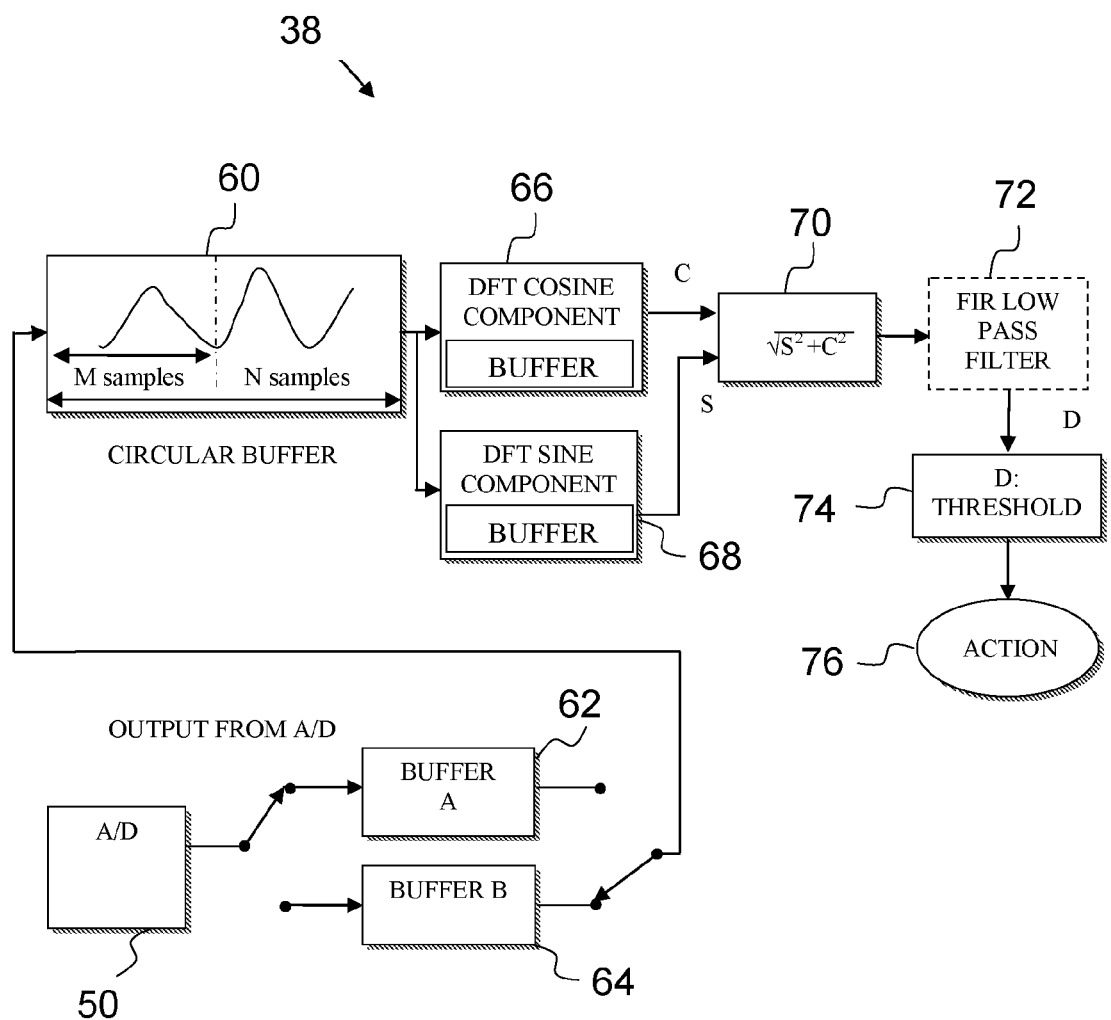
FIG. 3 is a schematic block diagram illustrating an exemplary implementation of the processing of proximity information read by the control electronics such as may be implemented for example, by the digital signal processor shown in FIG. 2.

Referring to FIG. 3, an example of processing that may be performed by the monitor 36 is illustrated. A circular buffer 60, e.g., within the controller 38, holds N measurements, e.g., digitized voltage readings, where N is any integer greater that or equal to M and M is the number of points in one cycle of the excitation signal generated by the excitation source 32. An exemplary approach to filling the circular buffer 60 is by constantly accumulating measurements or readings representing the sampled data from the analog to digital converter 50 in groups of size M. These readings may be saved in an alternating fashion, e.g., to a select one of two sample buffers 62, 64, either Buffer A or Buffer B as shown. When the currently selected sample buffer, e.g., Buffer A, becomes filled with M readings, its contents are transferred to the circular buffer 60 and the oldest samples in the circular buffer 60 are discarded. Also, the output of the analog to digital converter 50 is switched so as to accumulate readings into the remaining sample buffer, e.g., Buffer B in the above example.

After a group of M samples has been transferred into the circular buffer 60, the real and imaginary (cosine and sine) components of the DFT are calculated by a DFT cosine component filter at 66 and a DFT sine component filter at 68 respectively, for the entire contents of the circular buffer 60. These real and imaginary components, designated 'C' and 'S' in FIG. 3, are combined at 70, e.g., by taking the square root of the sum of C squared and S squared. The samples output at 70, designated 'D' may be passed on to a decimating low pass filter 72 that reduces the noise level and also reduces the sample rate to a manageable level if required by the particular implementation. The calculations at 66, 68 and 70, and the implementation of the low pass filter 72 (if required) may be performed in software, for example, as executed by the controller 38 using suitable algorithms and techniques.

The samples, D, coming from the output at 70 (or low pass filter 72) may be analyzed to identify events or conditions of interest. For example, the samples D may be compared to a pre-determined threshold value at 74 and an action may be triggered if the comparison corresponds to a triggering event. Thus, in an illustrative example, if the value of the sample D is less than the threshold, then the sensor capacitance is greater than the corresponding threshold capacitance, which may indicate the proximity of an object.

In this regard, it is observed from the schematic illustration shown in FIG. 2 that the measurement is taken at node A, at the junction of the capacitor 24, via the sense electrode 20 and the resistance component 44. The capacitive reactance of the capacitor 24 decreases as a function of increasing frequency thus forming an AC voltage divider or low pass filter circuit that discriminates against high frequencies. That is:

$$|Vout| = |Vin|\frac{1}{\sqrt{(1+\omega^2 R^2 C^2)}}$$

If an object interferes with the field, the total capacitance (C) of the capacitor 24 increases. Thus, for a given excitation signal frequency (f where $\omega=2\pi f$) and amplitude |Vin| and for a given resistance component 44 (R), an increase in the total capacitance C causes a decrease in |Vout|. In this regard, |Vout| corresponds to the measurements and thus is related to the computed value D.

Accordingly, an action can be taken at 76, e.g., implementing a collision avoidance operation or performing any other desired action. The action taken at 76 may alternatively consider numerous other and/or alternative factors to a comparison with a threshold value. For example, an action may be based upon, or further consider, detected changes in the sample value D, the time rate of change of the samples D, or other factors that define appropriate action criteria.

Although an illustrative and exemplary system is shown and described that utilizes two sample buffers 62, 64 and a corresponding circular buffer 60, other arrangements may be implemented to analyze the output from the analog to digital converter 50. Further, it may be possible to perform simplifications, such as computing only one of the DFT components, depending upon the requirements of a specific implementation of the controller 38.

In an illustrative implementation, the controller 38 is configured based upon a plurality of assignable parameters. This allows, for example, easy changing of system performance, simply by changing one or more of the parameters. Some exemplary programmable parameters that are useful to set up a capacitive sensor 16 comprises an excitation frequency f the number of cycles K (which may be implied if only a single cycle is utilized), a filter output sample rate fsr and a DFT filter length N.

The number of cycles K may be used to define the number of cycles represented in the lookup table data that describes the excitation signal and may be set to a value of 1 or implied as having a value of 1, for example, in a system with single cycle excitation signal lookup table. However, there are instances where it is useful to store a multi-cycle approximation of the excitation signal in a lookup table. For example, the digital to analog converter 40 and the analog to digital converter 50 may be replaced with a single codec. However, such devices typically have a limited number of sample rates, e.g., 48 kHz and 96 kHz.

Figure 4:
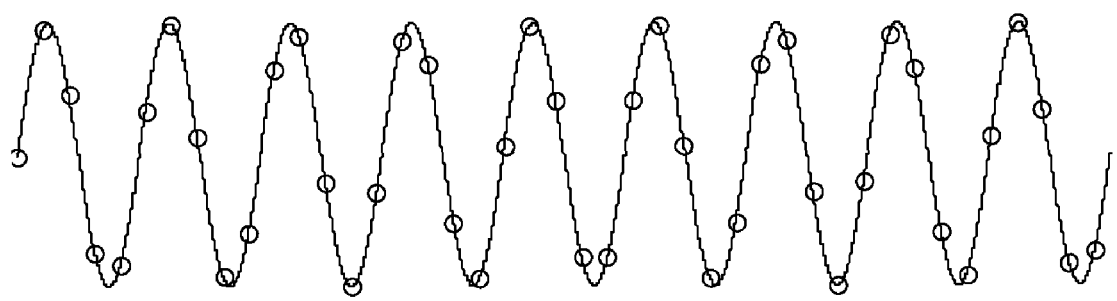
FIG. 4 is an illustration of an exemplary excitation signal showing several exemplary sample points.

Thus, depending upon the algorithm used to implement the digital representation of the excitation signal, a multi-cycle wave approximation can be stored in memory as an alternative to a single cycle wave approximation to digitally describe the excitation signal. The modified approach approximates a wave over several cycles, as schematically represented in FIG. 4.

Using the values stored or otherwise programmed into these parameters, the controller 38 may calculate the data lookup values for a T length periodic wave look up table. For example, an integer number of excitation cycles, K of a periodic signal, e.g., a sine wave is chosen and the wave is approximated over that number of cycles. The total number of steps, T, in the periodic wave approximation is given by:

$$T = \text{int}\left(K \cdot \frac{sr}{f}\right)$$

where sr is the known digital to analog conversion sample rate. The T scaled steps may be placed, for example, in a lookup table and may be utilized by the excitation source 32 (shown in FIG. 2) to generate the excitation signal that is used to drive the circuit 34 as described in greater detail herein. The maximum generated frequency f should be less than one half of the sample rate to satisfy the Nyquist condition.

Two N length coefficient buffers are also calculated, one for the DFT cosine component filter 66 and one for the DFT sine component filter 68.

The angular spacing between points in the D/A sine wave approximation, Δa, is:

$$\Delta a = 2 \cdot \pi \cdot \frac{K}{T}$$

This angular difference is used in the construction of the filter coefficient buffers, so the filters are automatically tuned to the excitation frequency. The coefficient buffers may be modified by a windowing curve or other suitable processing techniques to improve the signal to noise ratio.

Figure 5:
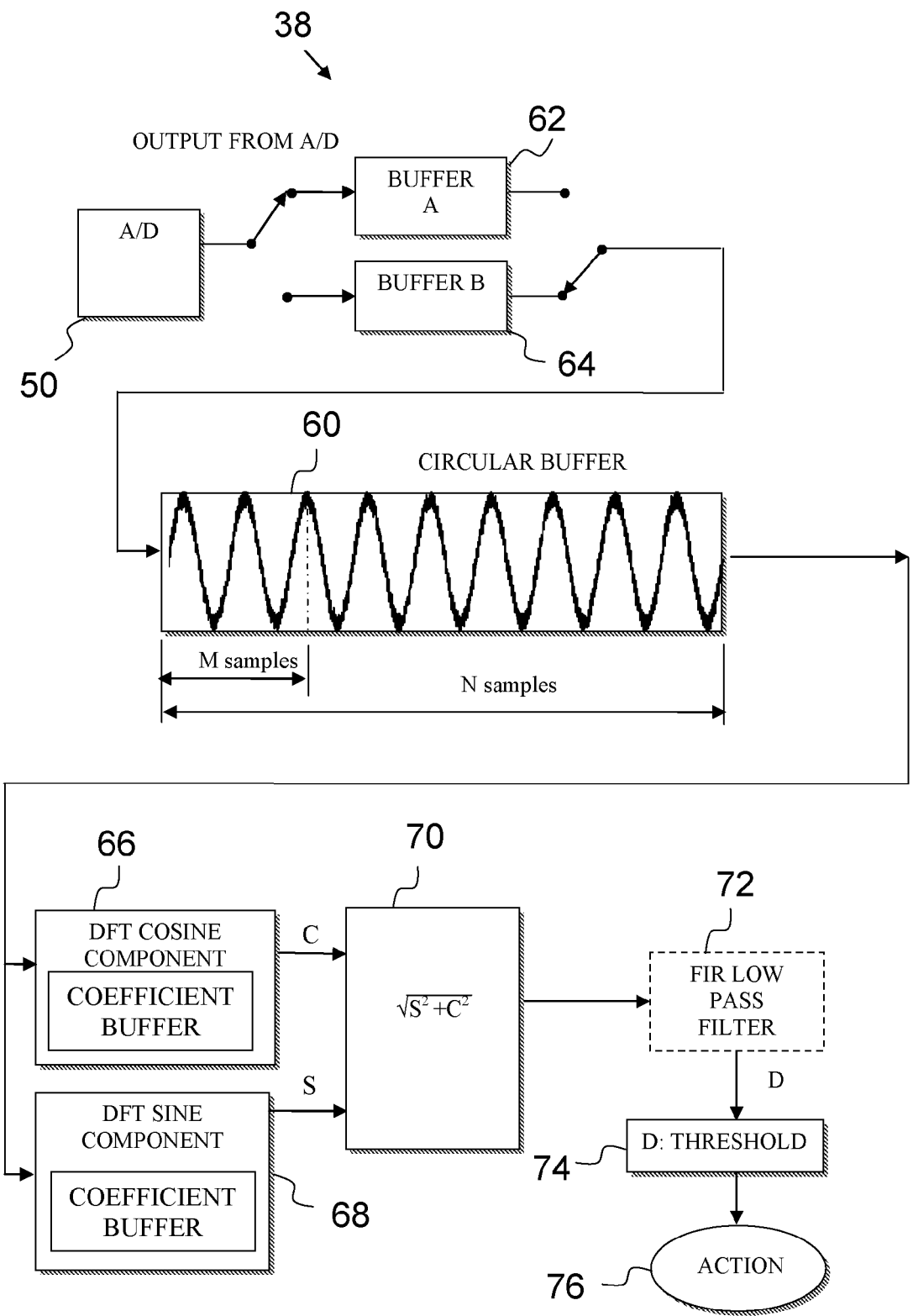
FIG. 5 is a schematic block diagram illustrating an exemplary implementation of the processing of proximity information read by corresponding control electronics.

Referring to FIG. 5, the illustrated processing system is similar to that described with reference to FIG. 3, but is altered in a manner to take into consideration, the multi-cycle approximation of the excitation frequency. Assume that the analog to digital converter is operated at the same sample rate as the digital to analog converter, and stores readings in groups of size M in one of two "ping-pong" sample buffers, A and B, also designated in FIG. 5 as 62, 64 respectively. The group size M may be set, for example, by the desired filter output sample rate:

$$M = \text{int}\left(\frac{sr}{fsr}\right)$$

After a select one of the sample buffers 62, 64 is filled, e.g., Buffer A, its contents are transferred to the N length circular buffer 60 (where N is greater than or equal to M) and the M oldest readings in the circular buffer 60 are discarded. At this time, the sine and cosine DFT filter outputs S and C are computed at 66 and 68 respectively, for example, according to the following equations:

$$C = \sum_{i=1}^{N}(cc_i \cdot r_i) \quad S = \sum_{i=1}^{N}(sc_i \cdot r_i)$$

where $cc_i$ is a cosine coefficient, $sc_i$ is a sine coefficient, and $r_i$ is a circular buffer reading. The final result is computed by taking the square root of the sum of the squares of S and C at 70. That is:

$$D = \sqrt{S^2 + C^2}$$

Calculating the filter results after a group of readings have been taken may be utilized to reduce the filter output sample rate to a more manageable level and to provide more time for the filter subroutines to run, if necessary or desirable in the particular implementation.

The filter response time, ft, is determined by the length of the filter, N:

$$ft = \frac{N}{2 \cdot sr}$$

In a manner analogous to that described with reference to FIG. 3, the samples, D, coming from process at 70 (or the optional low pass filter 72) may be analyzed to identify events or conditions of interest. For example, the sample D may be compared to a pre-determined threshold value at 74. If the value of the sample D is less than the threshold then the sensor capacitance is greater than the threshold capacitance, indicating the proximity of an object in the present example. Accordingly, an action can be taken at 76, e.g., implementing a collision avoidance operation or performing any other desired action.

Depending upon the intended application, it is possible that the ambient capacitance is likely to change as the capacitive sensor 16 is moved about a defined space. If this is the case, it may be necessary to modify the criteria upon which the data measured by the monitor 36 is analyzed, thus providing spatial accommodations for anticipated environmental conditions. For example, the threshold value used for a decision at 74 may need to be compensated, adjusted or otherwise modified for different positions in space.

In one exemplary use, the capacitive sensor 16 may be coupled to an arm or other movable part of the machine 14, which moves about in a defined space. If the application of the capacitive sensor 16 is to provide collision avoidance, the signal measured by the monitor 36 may be compared to a threshold to designate the likelihood of an imminent collision. However, at different points in space and/or at different points in time, the measured capacitance of the capacitive sensor 16 may vary, even with no threat of collision, e.g., under steady-state ambient conditions. This may be due, for example, to structures that interfere with the field of the capacitive sensor 16, which are incapable of causing a collision, such as the proximity of the capacitive sensor 16 to the housing or other fixed or movable components of a corresponding machine or other surfaces associated with a given system.

According to an aspect of the present invention, the control electronics may integrate intelligent apparatus spatial data with the proximity sensor data read from each capacitive sensor for dynamic threshold calibration and/or run-time threshold adjustment of the capacitor sensor output. This allows, for example, the system 10 to ignore the known or predicted intrusion of objects proximate to a corresponding capacitive sensor 16 that will not cause a collision. Thus, as will be described in greater detail below, components that are programmed to transition or are otherwise manually moved into close proximity with, but will not or cannot collide with the capacitive sensor/system component, can be "programmed out" so as to not trigger a collision avoidance scheme. The mapping may be implemented as a function of detected, measured, approximated or otherwise known position, time, condition or other parameter. Moreover, the mapping may comprise a single or multidimensional range of values, offsets or other parameters.

Figure 6:
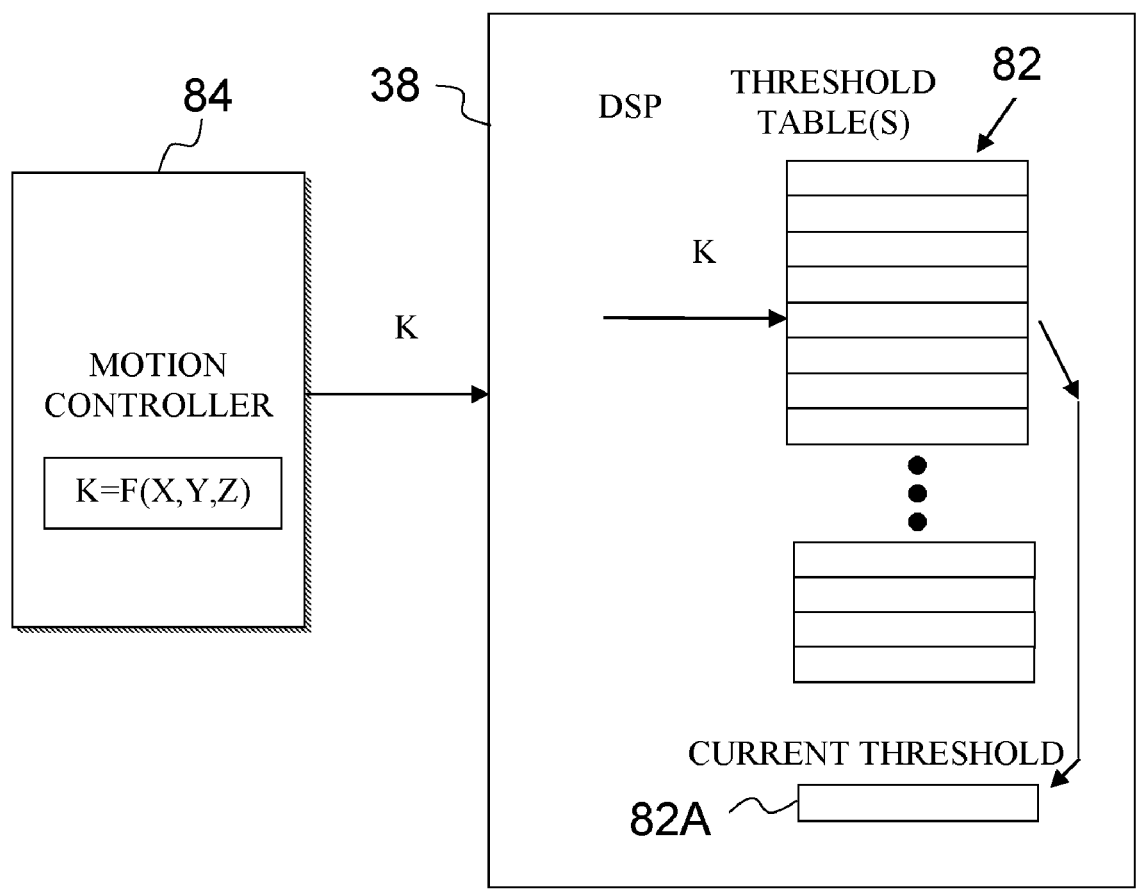
FIG. 6 is a schematic illustration of a threshold table for tracking threshold values across a range of positions according to an aspect of the present invention.

Referring to FIG. 6, the threshold value or other criteria used to evaluate the data measured by the monitor 36, e.g., the comparison of samples D to threshold values at 74 and corresponding action at 76, may be dynamically updated, modified, compensated, or otherwise adjusted in a manner that considers the anticipated actual ambient capacitance at various points in space and/or the ambient capacitance at positions over time. For example, an envelope of the capacitive sensor 16 may be divided into an array of blocks 82. The array of blocks 82 may be a single dimension or multidimensional, and may further include a corresponding identification, e.g., each block 82 may be assigned an identifying number. A program, which may be executed in its own thread in the controller 38, a motion controller 84 or other processing device, monitors the position of the capacitive sensor 16 or component associated with the capacitive sensor 16, and sends the current block number, k, to the controller 38.

The controller 38 uses the received information K to select an appropriate block number or other corresponding identifier. In an exemplary implementation, the block number K serves as an index into a table of threshold values defined by the array of blocks 82 to retrieve the appropriate threshold or other information, e.g., as seen by the current threshold block 82A, for use in determining whether an action is required. In practice, the threshold values and/or other information for dynamic updating may be stored in one or more tables, databases, arrays, linked lists, blocks, segments or other logical arrangements that allow the controller 38 to retrieve the appropriate information.

For example, when the capacitive sensor 16 moves in space, its position can be mapped from one block to another. In addition or as an alternative, the controller 38 may utilize the known position of an external object or objects, e.g., another moving or stationary surface of the system relative to the sense electrode 20, to select an appropriate index into the table(s) 82. As noted above, the position information provided by the motion controller 84 may map to static blocks in the array of blocks 82, such as where the desired threshold for a given point in the defined space does not change over time. Alternatively, the mapping of a point in the defined space to a corresponding block in the array of blocks 82 can vary dynamically, e.g., over a prescribed interval, etc. Accordingly, the controller 38 can accommodate not only preprogrammed or otherwise anticipated transitions, but also approved transitions that may occur asynchronously during an operation.

The threshold table(s) 82 may be built, for example, by a mapping procedure in which the capacitive sensor 16 is moved throughout its range of motion within a defined space. The defined space is further conceptually mapped out into blocks 82 and sensor capacitance readings are recorded for each block 82. In this regard, the number and/or size of the blocks 82 may be utilized, for example, to determine the sensitivity of the system. Moreover, the blocks can be of varying sizes and shapes within the predefined space, so long as the system can uniquely identify the location of the capacitive sensor 16 as being positioned in a select one of the blocks 82. That is, the points recorded in the blocks 82 need not be evenly distributed throughout the defined space. Rather, the "resolution" or granularity of the defined space may be increased or decreased at areas or volumes throughout the defined space, e.g., as defined by more blocks 82 of threshold data per unit of the defined space in selected regions. Thus, the granularity may vary in one or more dimensions in any desired manner that is appropriate for the given application.

Moreover, the table(s) 82 can be multi-dimensional not only in space dimensions, e.g., X, Y and Z coordinates, but also in other dimensions. This aspect allows the proximity detection system 10 to take into consideration, multiple alternative threshold values at a given point of the capacitive sensor 16 in space, e.g., to account for a dynamic environment. For example, at a given point in space, a system may define multiple permutations of likely or otherwise anticipated objects that may or may not be proximate to the capacitive sensor 16. Thus, during a predetermined period of time, known objects may advance towards, then retreat from the known position of the capacitive sensor 16, which may be at a fixed position. Even though the capacitive sensor 16 is not moving, the threshold value is updated to account for the known object that is performing permitted movements about the space of the capacitive sensor 16. Still further, a separate table may be utilized for each dimension, or other techniques may be utilizes to store the information.

As an example of mapping, the mapping space may be defined by assigning lower and upper limits to axis positions. For example, a point (x,y,z) may be determined to be within the mapping space if:

$X\min \leq x < X\max$, $Y\min \leq y < Y\max$, and $Z\min \leq z < Z\max$

Under this arrangemnent, Xmin and Xmax are the minimum and maximum limits for the x axis, Ymin and Ymax are the minimum and maximum limits for the y axis and Zmin and Zmax are the minimum and maximum limits for the z axis. Points within the mapped space are defined by normalized coordinates, such as positive integers ranging from zero to some predetermined maximum value. For example, if the desired axis range is from 0 to 255, the equations to convert a point (x,y,z) to its mapped equivalent $(x_p, y_p, z_p)$ are:

$$x_p = \mathrm{int}\left(\frac{x - X_{min}}{X_{max} - X_{min}} \cdot 256\right)$$

$$y_p = \mathrm{int}\left(\frac{y - Y_{min}}{Y_{max} - Y_{min}} \cdot 256\right)$$

$$z_p = \mathrm{int}\left(\frac{z - Z_{min}}{Z_{max} - Z_{min}} \cdot 256\right)$$

For spatial position mapping, the map may contain a three dimensional array of sensor readings taken at predetermined intervals. These intervals are specified, for example, in three tables, one per axis. Under this arrangement, each table contains a list of normalized (but not necessarily evenly linearly spaced) axis positions, arranged in ascending order. Any combination of X, Y, and Z values taken from the tables thus defines the position of a mapped point and the location of a value within a table determines an index into the 3D array of sensor readings.

As an example of extracting a mapped value, assume first, that an x axis position is normalized to $x_p$. Then, the X table is searched to find an entry that satisfies the condition $Xi \leq xp < Xi+1$. This gives the index i into the map array. The y axis index j and the z axis index k are found in a similar manner. The mapped point will thus conceptually be within a box having corners at Xi, Xi+1, Yj, Yj+1, Zk, and Zk+1. The sensor threshold at (xp, yp, zp) may be further estimated, such as by employing a three dimensional interpolation technique using the 8 points of the enclosing box and the corresponding map entries of the points.

Also, in a simplified illustrative example of a threshold table implementation, the threshold for a given block 82 may be determined by adjusting a target value by an offset value, which is stored in the threshold table. For example, the steady state sensor signal can be measured at a known point, e.g., at a predetermined root block 82. The capacitive sensor 16 is then moved to another block 82, and the steady-state signal of the capacitive sensor 16 is measured. The stored threshold value for the current block 82 may be an offset corresponding to the difference between the measured signal at the current block position compared to the value of the signal at the root block 82. This technique may be utilized to reduce the amount of storage space required to store the various threshold values for each block 82. Other arrangements may be implemented to store the various threshold values.

According to an aspect of the present invention, the approximate position of the capacitive sensor 16 (and/or the position of other known surface components of the system relative to the capacitive sensor 16) must be known in order to determine which block 82 represents the approximate current position of the capacitive sensor 16. For example, the controller 38, motion controller 84, or other controller, may ascertain the approximate location of the capacitive sensor 16 in space. The position of the capacitive sensor 16 may be determined for example, using servo position feedback devices such as encoders or resolvers, potentiometers, appropriately placed limit switches and other known position determining techniques. The position of the capacitive sensor 16 may be computed, e.g., by knowing a previous position and corresponding position offsets, or the position of the capacitive sensor 16 may be approximated, e.g., using heuristics and other processing techniques. If machine position information can be made available to the controller 38, the threshold adjusting procedure could be performed within the controller 38 itself, simplifying the interface between the machine 14 and the proximity detection system 10. Otherwise, the controller 38 may output suitable information to another machine processor for suitable processing.

Machine position information may be unnecessary if other techniques are available to determine position, e.g., if the machine moves through a predetermined path or exhibits determinable movements in response to detectable events. Under this arrangement, the threshold table may be built by moving the capacitive sensor 16 through its entire path while periodically recording sensor readings. Each reading may become a threshold, such as by subtracting an offset from it. Under this arrangement, if the capacitive sensor 16 is utilized in a collision avoidance system, as the capacitive sensor 16 follows its path the sensor readings are compared to the expected capacitance profile that is stored in the threshold table.

As noted above, it is possible that asynchronous as well as synchronous motions may occur that disturb the field of the capacitive sensor 16 where those disturbances are caused by structures that are incapable of causing a collision or should otherwise not be detected. For example, a robotic arm may be independently operated in such a manner that it may move proximate to a capacitive sensor 16 installed on a machine 14. Due to the physical positioning of the robot arm, it may be possible for the robot arm to get close enough to the capacitive sensor 16 to disrupt the field and thus affect the measured capacitance, but not close enough to cause an impact with the machine 14. As another example, an arm having a capacitive sensor 16 thereon may be required to reciprocate in and out of an aperture in a housing. The housing around the aperture may disrupt the field of the capacitive sensor 16 thus affecting capacitance measurements despite not being capable of causing a collision with the arm.

As such, as described through numerous examples above, the processor is operatively configured to evaluate a measurement of the circuit including the capacitive sensor 16 and to trigger a predetermined action if the evaluation corresponds to a triggering event, where the processor dynamically updates at least one parameter associated with the evaluation. For example, the processor may update a lookup table address of a threshold value or otherwise modify a threshold value, modify parameters used to evaluate a function, expression and/or rule etc., to accommodate changes in at least one system condition. The change in system condition may comprise, for example, a position of the capacitive sensor 16, a relative time, knowledge of the position of other anticipated objects near the capacitive sensor 16, etc.

Figure 7:
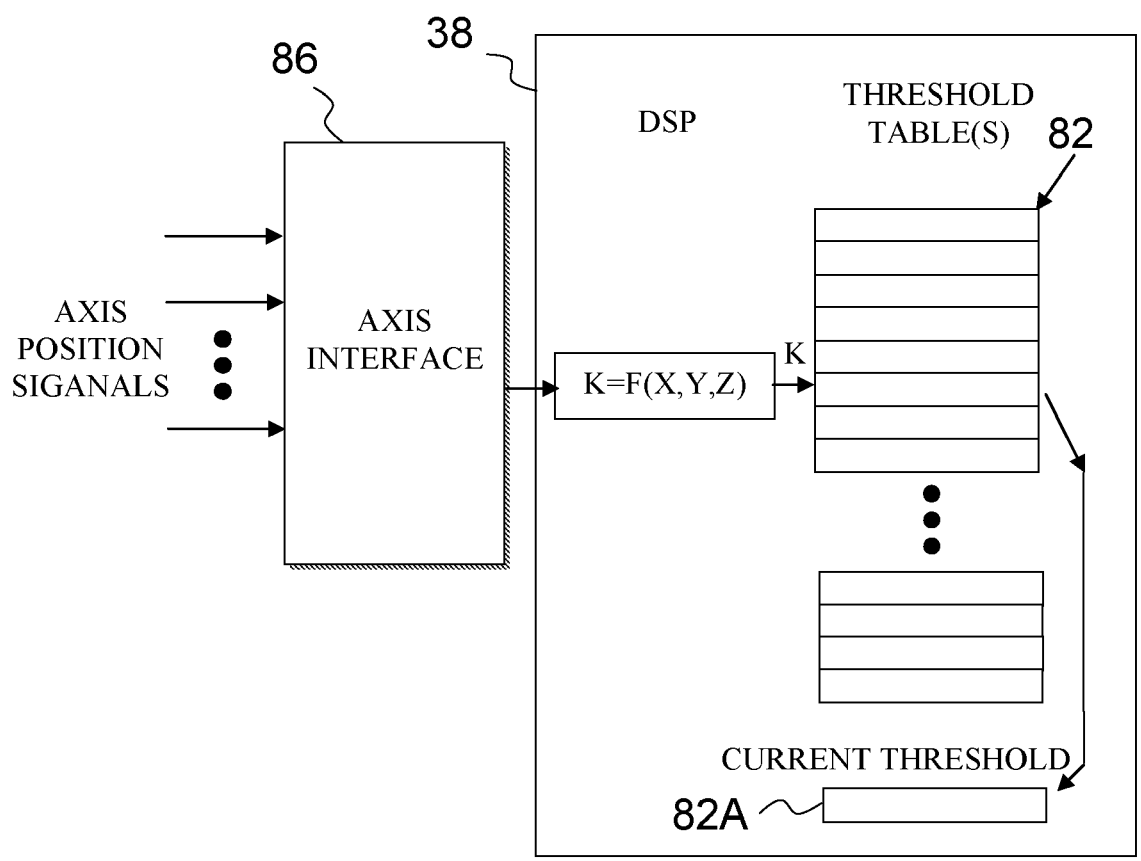
FIG. 7 is a schematic illustration of a threshold table for tracking threshold values across a range of positions according to another aspect of the present invention.

Referring to FIG. 7, another exemplary approach to providing axis position information to the controller 38, e.g., a system DSP is illustrated. In the arrangement illustrated in FIG. 7, the controller 38 is provided with the axis positions directly, thus avoiding any potential delay that may be required for the motion controller 84 to calculate the map index k and to send the information corresponding to k to the controller 38. As illustrated, axis position signals corresponding to the location of the capacitive sensor 16 are communicated to an axis interface 86 that couples the position signal information directly to the processor/controller 38. The controller computes the map index k into the threshold table 82 to obtain the current position.

As noted above, although described with reference to a threshold table 82 for purposes of illustration, the comparison that is performed to determine whether an event of interest has occurred requiring action, e.g., encroachment of an object of interest such as a person or other machine part towards the capacitive sensor 16, may be based upon techniques other than threshold values. For example, functions such as rules, algorithms, expressions and other types of information may be evaluated, computed or otherwise derived in making such decisions. For example, a function that determines a rate of change of capacitance may be used to evaluate whether an action is required. Under this arrangement, if a rate of change exceeds a predetermined function value, then an action may be taken.

Figure 8:
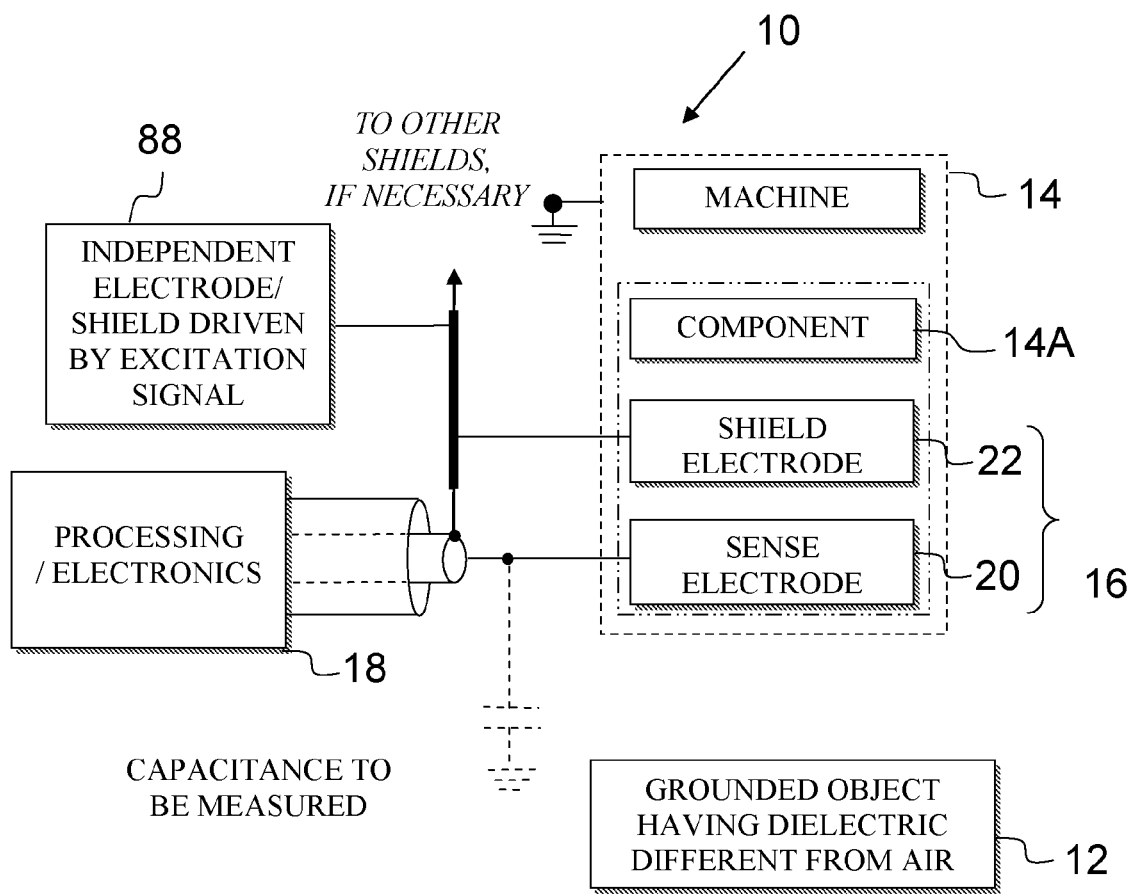
FIG. 8 is a schematic block diagram illustrating the use of electrodes/shields external to a sensor to discriminate objects that are anticipated to be proximate to the sensor and which are not to be detected.

Referring to FIG. 8, according to another aspect of the invention, if defined objects should not be sensed as potential targets of interest, e.g., collision targets, then such structures can be shielded from the proximity detection system 10. For example, if an insulated electrode, driven by the same signal that drives the sensor shield 16 and its cable, is placed between the object and the sensor, then the apparent capacitance measured by the control electronics 18 can be made to decrease, rather than increase, as the capacitive sensor 16 approaches the object, thus providing a mechanism for object discrimination. For example, the illustrated proximity detection system 10 is substantially the same as the proximity detection system 10 illustrated and described with reference to FIG. 1. However, as shown, independent shields 88 are positioned as necessary, e.g., on or around parts of the machine 14 that are not part of the assembly of the capacitive sensor 16. The shields 88 are driven by the same signal that drives the shield electrode 22.

Figure 9:
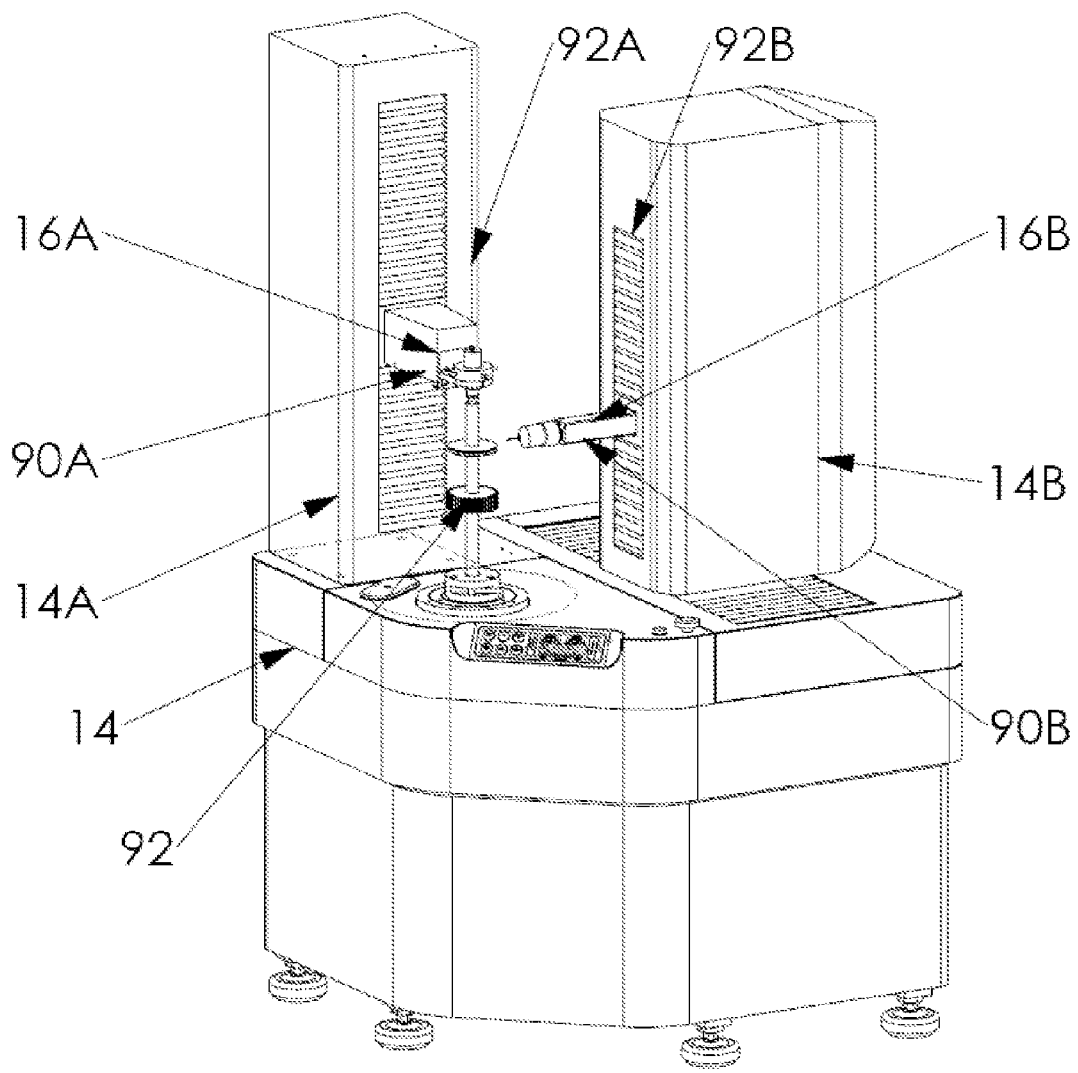
FIG. 9 illustrates an exemplary gear inspection machine that may incorporate various aspects of the sensor systems of FIGS. 1-8.

Referring to FIG. 9, a machine 14, illustrated as a coordinate measurement machine such as a gear measurement machine, includes a first housing member 14A and a second housing member 14B. A first arm 90A is operable to traverse up and down within the first housing member 14A, e.g., substantially in a vertical plane. A first capacitive sensor 16A is coupled to the first arm 90A. Similarly, a second arm 90B is operable to traverse up and down within the second housing member 14B, e.g., substantially in a vertical plane. The second arm 90B is also controllable to transition out from and retract into the second housing member 14B, e.g., substantially in a horizontal plane. A second capacitive sensor 16B is coupled to the second arm 90B. The first and second capacitive sensors 16A, 16B are constructed in a manner described more fully herein. Moreover, the processing/electronics 18, including the controller 38, (not shown) can be placed in any appropriate location.

The sensors 16A, 16B may be physically attached to, or integrated into the construction of their respective first arm 90A and second arm 90B. The face of the first housing member 14A includes a shield 92A that is driven by the same excitation signal used to drive the shield electrode of the first capacitive sensor 16A. As described more fully herein, this prevents the corresponding controller from triggering a false positive object signal as the first arm 90A is moved up and down, in the first housing member 14A while inspecting the gear 92. Likewise, the face of the second housing member 14B includes a shield 92B that is driven by the same excitation signal used to drive the shield electrode of the second capacitive sensor 16B. This prevents the controller from triggering a false positive object signal as the second arm 90B is moved up and down, and in and out of the second housing member 14B while inspecting the gear 92.

In the exemplary machine 14, the work piece comprises a gear 92 that is to be inspected. In order to prevent the gear 92 and the first and second arms 90A, 90B from affecting the evaluation of sensor measurements so as to otherwise cause an unintended triggering event, the proximity detection system may utilize table lookup and/or other techniques as described more fully herein, for each capacitive sensor 16A, 16B, e.g., such as that described with reference to FIGS. 6-7 to properly filter, compensate for or otherwise tune out, the respective effects of those components.

Figure 10:
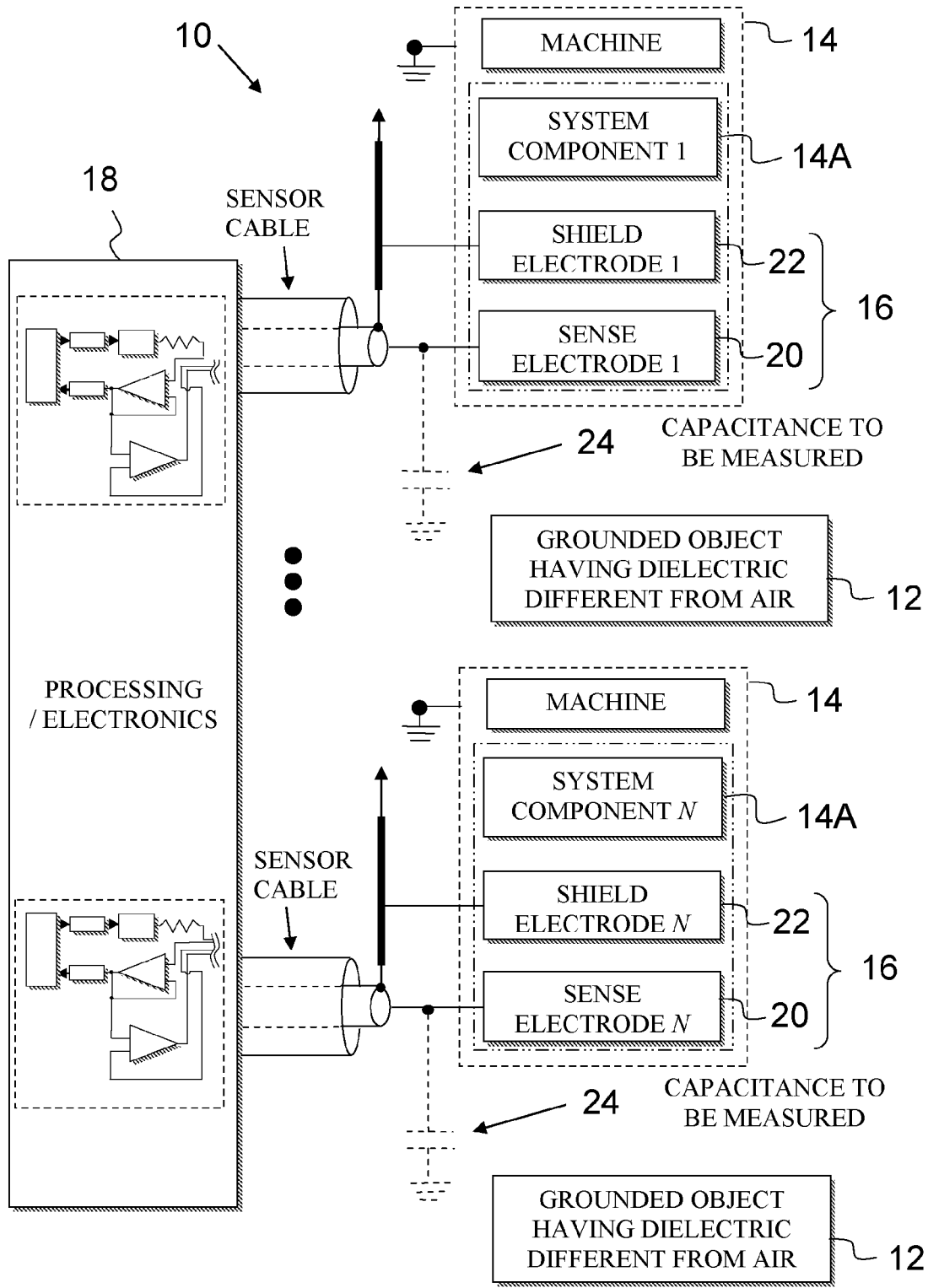
FIG. 10 is an illustration of a system having multiple sensors.

Referring to FIG. 10, an exemplary approach to utilizing multiple sensors 16 is illustrated. A capacitive sensor 16 is provided for each machine component surface where it is desired to provide proximity sensing. For example, as shown, there are N sensors, each associated with a machine component surface of interest (1–N). Each capacitive sensor 16 is coupled to the processing electronics 18 as described more fully herein. For example, each capacitive sensor 16 may be coupled to a unique instance of the circuit 34, digital to analog converter 40, signal conditioning circuit 42, buffer/amplifier 48, analog to digital converter 50 and driver circuit 54. However, a single DSP or other suitable processor may perform all of the processing for each of the sensors 16. Moreover, a single physical digital to analog converter 40 or analog to digital converter 50 may be utilized, for example, where the physical implementation can be divided out, such as by having multiple channels or instances of the converter in a single package, or by performing a multiplexing operation, etc.

For example, four parameters may be specified in the processor to set up each sensor: its excitation frequency, which is programmed to a different frequency for each sensor, the number of cycles in the lookup table that approximates the excitation signal, the filter output sample rate fsr, and the DFT filter length. This approach allows the system to be expanded and/or modified without substantial changes to source code that controls the digital signal processing. For example, additional sensors can be easily added to a system by simply establishing a unique set of parameters for the new sensor, without a need to reconfigure the older sensor parameters.

Using these programmed numbers for each capacitive sensor 16, the controller 38 calculates the T length excitation signal look up table and two coefficient buffers (based upon the programmed DFT filter length), one for the sine filter, and one for the cosine filter. During operation, the controller 38 outputs an excitation signal to each corresponding digital to analog converter 40 based upon its programmed excitation frequency. The controller 38 also receives samples from each corresponding analog to digital converter 50, and processes each sample stream substantially as described more fully herein. Alternatively, more and/or different parameters may be specified other than those described above.

Figure 11:
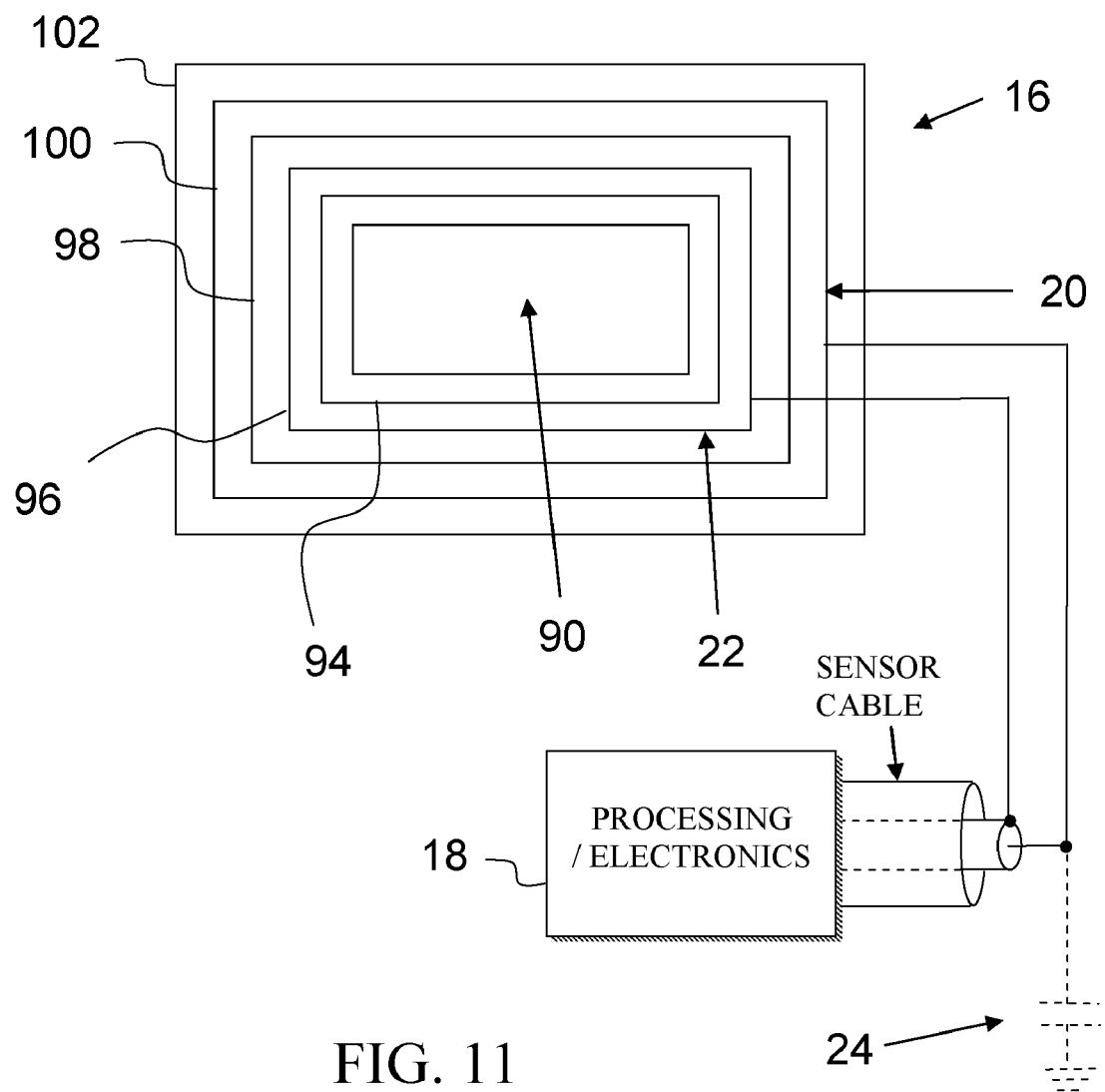
FIG. 11 is a cross-section illustration of a three dimensional sensor assembly that is assembled on a rectangular system component for purposes of illustration.

Referring to FIG. 11, the proximity detection system 10 is operable using any suitable sensor configuration, including sensors 16 that are substantially flat, generally, conformal to a corresponding part, etc. For example, in an illustrative arrangement, a sensor 16 is illustrated on a three dimensional (3-D) probe arm tube 90. The sensor 16 comprises a plurality of layers including an optional adhesive layer (not shown), an inner insulator 94, a first conductive layer 96, an intermediate insulator 98 and a second conductive layer 100. In particular, the probe arm tube 90 is covered with the inner insulator 94. For example, the inner insulator 94 may comprise a heat-shrink tube or other insulating material(s). The first conductive layer 96 is formed over the inner insulator 94 to form the shield electrode 22. For example, the inner insulator 94 may be coated with a layer of electrically conductive paint or other conductive material(s). The intermediate insulator 98 is placed over the first conductive layer 96 and may comprise a heat shrink tube or other insulating material(s). The second conductive layer 100 is formed over the intermediate insulator 98 to form the sense electrode 20. For example, the second conductive layer 100 may also comprise a layer of conductive paint or other conductive material(s). An outer protective layer 102 may be provided over the second conductive layer 100 to provide protection, durability and any desired aesthetics to the sensor 16.

As yet another example, the sensor may comprise one or more generally flat "adhesive stickers" that are connected in parallel. In the exemplary structure of FIG. 11, the probe arm tube 90 has a generally rectangular cross-section. As such, the sensor 16 may be comprised of four assemblies, e.g., implemented as generally flat, adhesive stickers arranged such that one adhesive sticker is applied to each of the four surfaces. Each adhesive sticker comprises an inner insulator 94, a first conductive layer 96, an intermediate insulator 98, a second conductive layer 100 and outer protective layer 102 as described above. Moreover, the first conductive layer 96 of each of the stickers is electrically connected in parallel and the second conductive layer 98 of each of the stickers is electrically connected in parallel to form a single sensor 16.

The dimensions shown in FIG. 11 are exaggerated for purposes of clarity of discussion herein.

As noted above, a capacitive sensor may be attached to, incorporated or integrated with, or otherwise associated with a position of interest where it is desirable to detect, track, monitor or otherwise recognize the presence of objects that are or become proximate to the position or positions of interest. Accordingly, capacitive sensors and the corresponding process electronics can be integrated with machines or retrofitted onto existing machines.

The software aspects of the present invention may be stored, implemented and/or distributed on any suitable computer usable or computer readable medium(s), including but not limited to, any medium that can contain, store, communicate, propagate or transport the program for use by or in connection with an instruction execution system of a corresponding processing device. The computer program product aspects of the present invention may have computer usable or computer readable program code portions thereof, which are stored together or distributed, either spatially or temporally across one or more devices. A computer-usable or computer-readable medium may comprise, for example, an electronic, magnetic, optical, electromagnetic, infrared, or semiconductor system, apparatus, device, or propagation medium.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The flowchart and block diagrams in the Figures illustrate the architecture, functionality, and operation of possible implementations of systems, methods and computer program products according to various aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

Having thus described the invention of the present application in detail and by reference to embodiments thereof, it will be apparent that modifications and variations are possible without departing from the scope of the invention defined in the appended claims.

What is claimed is:

1. A proximity detection system comprising:
   a capacitive sensor that is arranged to secure to a surface of a system component having a sense electrode and a shield electrode;
   an excitation source that generates an excitation signal for driving the capacitive sensor;
   a circuit that couples the excitation source to the capacitive sensor such that when the excitation signal from the excitation source drives the capacitive sensor, a capacitive field is generated relative to the sense electrode that corresponds to the capacitance of the capacitive sensor, wherein the presence of objects that are or become proximate to the capacitive sensor alter the capacitive field thus changing the overall capacitance of the capacitive sensor;
   a monitor that performs measurements of the circuit where the measurements are influenced by the capacitive field associated with the capacitive sensor, the monitor comprising a signal amplifier to buffer a signal read from the sense electrode of the capacitive sensor and a shield driver to drive the shield electrode of the capacitive sensor with a copy of the signal read from the sense electrode;
   a controller that evaluates one or more measurements taken by the monitor and triggers a predetermined action if the evaluation corresponds to a triggering event, wherein the controller is operatively configured to:
   required to satisfy the result of the evaluation with regard to the triggering event to accommodate changes in a known position of an object relative to the capacitive sensor that is not desired to trigger the predetermined action; and
   at least one threshold table that stores data values that are used by the controller to dynamically adjust a threshold value corresponding to the at least one dynamically updated parameter, wherein the controller is further configured to utilize a select one of the data values from the threshold table based upon a detected change in the known position of the object.

2. The system according to claim 1, wherein the controller is further configured to dynamically update the requirement to satisfy the triggering event based upon a value of a known position of the capacitive sensor within a defined space.

3. The system according to claim 1, wherein the controller is further configured to dynamically update the requirement to satisfy the triggering event based upon a value of a relative time.

4. The system according to claim 1, further comprising at least one shield that is placed between the capacitive sensor and a system component that is not intended to trigger the predetermined action, wherein each such shield is driven, wherein the capacitive sensor and the system component move relative to each other.

5. The system according to claim 1, further comprising:
   at least one additional capacitive sensor coupled to the proximity detection system, wherein:
   the excitation source is further configured to drive each capacitive sensor with a selected one of a plurality of unique excitation signals respectively;
   the monitor independently collects measurements from each capacitive sensor; and
   the controller is operatively configured to evaluate one or more measurements taken by the monitor for each sensor and to trigger a predetermined action if the evaluation corresponds to a triggering event.

6. The system according to claim 1, further comprising a cable that connects the capacitive sensor to the circuit, wherein the shield driver drives the shield electrode of the capacitive sensor with the copy of the signal read from the sense electrode so as to reduce effects of cable capacitance in the cable.

7. The system according to claim 1, wherein the capacitive sensor further comprises:
   an inner insulator over the surface of the system component;
   a first conductive layer over the inner insulator to form a shield electrode;
   an intermediate insulator over the inner insulator and first conductive layer; and
   a second conductive layer formed over the intermediate insulator to form the sense electrode.

8. The system according to claim 7, wherein:
   the first and second conductive layers comprise electrically conductive paint; further comprising:
   an outer protective layer provided over the second conductive layer.

* * * * *

UNITED STATES PATENT AND TRADEMARK OFFICE
CERTIFICATE OF CORRECTION

| | | |
|---|---|---|
| PATENT NO. | : 8,164,354 B2 | Page 1 of 1 |
| APPLICATION NO. | : 11/943630 | |
| DATED | : April 24, 2012 | |
| INVENTOR(S) | : Robert G. Lenz | |

It is certified that error appears in the above-identified patent and that said Letters Patent is hereby corrected as shown below:

Column 20, line 5, "required to satisfy the result of the evaluation with regard to the triggering event to accommodate changes in a known position of an object relative to the capacitive sensor that is not desired to trigger the predetermined action; and" should read
--dynamically update at least one parameter that alters the result of the evaluation required to satisfy the triggering event to accommodate changes in a known position of an object relative to the capacitive sensor that is not desired to trigger the predetermined action; and--.

Signed and Sealed this
Tenth Day of July, 2012

David J. Kappos
*Director of the United States Patent and Trademark Office*